(12) United States Patent
Ikei

(10) Patent No.: US 8,217,602 B2
(45) Date of Patent: Jul. 10, 2012

(54) MOTOR DRIVING APPARATUS AND CONTROL METHOD THEREOF

(75) Inventor: Satoshi Ikei, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 422 days.

(21) Appl. No.: 12/458,269

(22) Filed: Jul. 7, 2009

(65) Prior Publication Data
US 2010/0013422 A1 Jan. 21, 2010

(30) Foreign Application Priority Data
Jul. 15, 2008 (JP) ................................. 2008-183744

(51) Int. Cl.
*H03K 5/00* (2006.01)
(52) U.S. Cl. ............... 318/400.13; 318/400.24; 318/432
(58) Field of Classification Search ............. 318/400.13, 318/400.09, 430, 439, 801, 811, 400.24, 318/432; 307/9.1; 375/326; 363/37, 74
See application file for complete search history.

(56) References Cited

U.S. PATENT DOCUMENTS

| | | | | |
|---|---|---|---|---|
| 4,723,201 A * | 2/1988 | Tanamachi et al. | ............. | 363/41 |
| 6,704,212 B2 * | 3/2004 | Furukawa et al. | ............. | 363/41 |
| 7,176,645 B2 * | 2/2007 | Shimada et al. | ............. | 318/432 |
| 7,400,109 B2 * | 7/2008 | Nomura et al. | ............. | 318/801 |
| 7,443,116 B2 * | 10/2008 | Kutsuna et al. | ............... | 318/139 |
| 7,567,048 B2 * | 7/2009 | Shin et al. | ................. | 318/400.24 |
| 7,594,491 B2 * | 9/2009 | Yanagida et al. | ........ | 123/179.28 |
| 7,672,148 B2 * | 3/2010 | Shin et al. | ........................ | 363/98 |
| 7,729,146 B2 * | 6/2010 | Hayami et al. | .................. | 363/98 |
| 7,755,213 B2 * | 7/2010 | Ang | ............................ | 307/10.1 |
| 7,923,961 B2 * | 4/2011 | Takamatsu et al. | ........... | 318/811 |
| 2003/0142517 A1 * | 7/2003 | Furukawa et al. | ............... | 363/37 |
| 2006/0034364 A1 * | 2/2006 | Breitzmann et al. | .......... | 375/238 |
| 2007/0052382 A1 * | 3/2007 | Nomura et al. | ............... | 318/439 |
| 2007/0114965 A1 * | 5/2007 | Kutsuna et al. | ............... | 318/807 |
| 2007/0175429 A1 * | 8/2007 | Yanagida et al. | ........ | 123/179.14 |
| 2007/0252625 A1 * | 11/2007 | Shin et al. | ........................ | 327/113 |
| 2008/0089102 A1 * | 4/2008 | Hayami et al. | .................. | 363/74 |
| 2008/0089444 A1 * | 4/2008 | Shin et al. | ..................... | 375/326 |
| 2009/0160248 A1 * | 6/2009 | Ang | ............................ | 307/9.1 |
| 2010/0052583 A1 * | 3/2010 | Takamatsu et al. | ...... | 318/400.09 |

FOREIGN PATENT DOCUMENTS
JP 2-290174 11/1990
* cited by examiner

*Primary Examiner* — Paul Ip
(74) *Attorney, Agent, or Firm* — McGinn IP Law Group, PLLC

(57) ABSTRACT

Provided is a motor driving apparatus including a motor drive unit including a plurality of transistors which are repeatedly turned on and off in response to a pulse having a pulse width modulated at a first carrier frequency to control driving of a motor in a normal operation state and which supply a drive current to the motor; and a control unit that controls the plurality of transistors to be turned on and off in response to a pulse having a pulse width modulated at a second carrier frequency higher than the first carrier frequency, when a voltage applied between input terminals of the motor drive unit rises to a predetermined value.

20 Claims, 9 Drawing Sheets

MOTOR DRIVING APPARATUS AND CONTROL METHOD THEREOF

BACKGROUND

1. Field of the Invention

The present invention relates to a motor driving apparatus and a control method thereof, and more particularly, to a brushless DC motor.

2. Description of Related Art

Permanent magnet synchronous motors having a small size and a high output are now widely employed in the field of consumer products such as washing machines, refrigerators, and air conditioners which are required to be downsized.

Recent technological innovations in the field of power devices such as MOS-FETs make it possible to realize an inverter control in which a commercial AC power supply is temporarily rectified and converted into a DC power supply and is then regenerated into a given drive waveform through a switching operation of a power device. The inverter control facilitates power saving and control operation. Further, brushless DC motors for driving the permanent magnet synchronous motor as described above are now widely used.

FIG. 6 shows an inverter circuit 1A of a typical brushless DC motor. As shown in FIG. 6, the inverter circuit 1A includes transistors Q1 to Q6. The transistors Q1 and Q2, the transistors Q3 and Q4, and the transistors Q5 and Q6 are connected in series between a DC power supply voltage VDD and a ground voltage GND. The transistors Q1 to Q6 receive control signals U+, U−, V+, V−, W+, and W−, respectively.

FIG. 7 shows an example of voltage operation waveforms of the control signals U+, U−, V+, V−, W+, and W−. The transistors Q1 to Q6 each perform a switching operation of repeatedly turning on and off in pulse shapes as shown in FIG. 7. For example, during a time period between a time t0 and a time t2, the control signals U+ and V− become the high level at the same time, and the transistors Q1 and Q4 are simultaneously turned on. As a result, a current flows through a U-phase coil and a V-phase coil of a brushless DC motor 2A. Likewise, during a time period between the time t2 and a time t4, the control signals V+ and W− become the high level at the same time, and the transistors Q3 and Q6 are simultaneously turned on. As a result, a current flows through the V-phase coil and a W-phase coil of the brushless DC motor 2A. After that, the transistors are switched in response to the control signals in a similar manner, which enables the inverter circuit 1A to generate a drive current for the brushless DC motor 2A.

In this exemplary embodiment, the brushless DC motor 2A is a three-phase motor. Thus, the on/off timing of each of the transistors Q1 of Q6 is adjusted so that currents having phases shifted by 120° from each other flow through the U-phase, V-phase, and W-phase coils of the brushless DC motor 2A. Note that the control signals U−, V−, and W− are inverted signals of the control signals U+, W+, and V+, respectively.

Furthermore, pulse width modulation (hereinafter, referred to as "PWM") control is employed to control driving of a motor through the switching operation as described above. The PWM control is now most widely employed as a method of controlling a DC motor. The PWM control will be briefly described with reference to graphs shown in the upper and lower portions of FIG. 8. Note that the graph in the lower portion of FIG. 8 shows the control signal U+, for example, as one phase of the control signals U+, U−, V+, V−, W+, and W− each having a modulated pulse width. The other control signals have a shifted phase, but the control signals are signals having a similar waveform or inverted signals thereof.

In the PWM control of this exemplary embodiment, a triangular wave is used as a carrier as shown in the graph of the upper portion of FIG. 8. In addition, a command voltage signal shown in the graph of the upper portion of FIG. 8 is used to control the number of rotations of the motor to a desired value. The command voltage signal and the triangular wave are compared with each other to thereby determine the pulse width of the control signal U+ as shown in the graph of the lower portion of FIG. 8.

As shown in the graph of the lower portion of FIG. 8, when the amplitude of the command voltage signal is high, the pulse width of the control signal U+ is large. Meanwhile, when the amplitude of the command voltage signal is low, the pulse width of the control signal U+ is small. When the pulse width is large, the transistor is turned on for a long time, which leads to an increase in the current flowing through the coils of the motor and an increase in the number of rotations of the motor. Meanwhile, when the pulse width is small, the transistor is turned on for a short period of time, which leads to a reduction in the number of rotations of the motor. In the PWM control, as described above, the pulse width modulation is performed on the command voltage signal, and the number of rotations of the motor is controlled by, for example, the control signal U+ having the modulated pulse width.

In this case, in the inverter control for the brushless DC motor, if the driving of the motor cannot be controlled due to rapid deceleration of the motor, a system malfunction, or the like, the motor comes into a regenerative (power generation) state owing to load inertia, resulting in generation of a large back electromotive force. In order to prevent the motor, the transistors of the inverter circuit, a smoothing capacitor of a converter circuit for supplying a power supply to the inverter circuit, or the like from being damaged by the back electromotive force, it is necessary to provide means for removing the back electromotive force.

Japanese Unexamined Patent Application Publication No. 02-290174 discloses a motor driving apparatus 1B for short-circuiting the coils of the motor or short-circuiting the coils and a ground, upon detection of an abnormality of a power supply supplied to a motor drive circuit by the back electromotive force. FIG. 9 shows a circuit configuration of the motor driving apparatus 1B disclosed in Japanese Unexamined Patent Application Publication No. 02-290174. As shown in FIG. 9, the motor driving apparatus 1B includes a power supply circuit 2B, a motor drive circuit 3B, a motor 4B, a detection circuit 5B, a bias circuit 6B, and an FET 7B.

SUMMARY

In the motor driving apparatus 1B disclosed in Japanese Unexamined Patent Application Publication No. 02-290174, the power supply voltage supplied to the motor drive circuit 3B rises due to the back electromotive force generated by the motor 4B coming into the regenerative state. Thus, when the detection circuit 5B detects an abnormality of the power supply voltage supplied to the motor drive circuit 3B, the bias circuit 5B causes the FET 7B to turn on to thereby short circuit the coils of the motor 4B. This allows the motor 4B to provide regenerative (power generation) breaking, and also allows the motor 4B itself to eliminate the back electromotive force. In this method, however, the motor 4B is rapidly stopped, and a mechanical load is applied to the motor itself. This leads to a deterioration in the mechanical reliability of the apparatus, and an increase in the risk of causing a failure. Moreover, a control circuit such as a bias circuit is required, which causes a problem of an increase in circuit size.

A first exemplary aspect of an embodiment of the present invention is a motor driving apparatus including a motor drive unit including a plurality of transistors which are repeatedly turned on and off in response to a pulse having a pulse width modulated at a first carrier frequency to control driving of a motor in a normal state and which supply a drive current to the motor; and a control unit that controls the plurality of transistors to be turned on and off in response to a pulse having a pulse width modulated at a second carrier frequency higher than the first carrier frequency, when a voltage applied between input terminals of the motor drive unit rises to a predetermined value.

A second exemplary aspect of an embodiment of the present invention is a method of controlling a motor driving apparatus including a plurality of transistors which are repeatedly turned on and off during a predetermined period of time to control driving of a motor in a normal operation state and which supply a drive current to the motor, the method including controlling the plurality of transistors to be turned on and off in response to a pulse having a pulse width modulated at a second carrier frequency higher than a first carried frequency, when a regenerative electromotive force generated by the motor occurs.

According to an exemplary embodiment of the present invention, the plurality of transistors are controlled to be turned on and off in response to the pulse having the pulse width modulated at the second carrier frequency higher than the first carried frequency, which increases a switching loss. In the case where the motor comes into a regenerative (power generation) state or the like, when the voltage applied between the input terminals rises to the predetermined value due to the back electromotive force, the electromotive force can be absorbed as thermal energy as a result of the increased switching loss.

According to an exemplary embodiment of the present invention, the back electromotive force can be absorbed to thereby avoid any mechanical damage to a motor, without increasing the circuit size.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
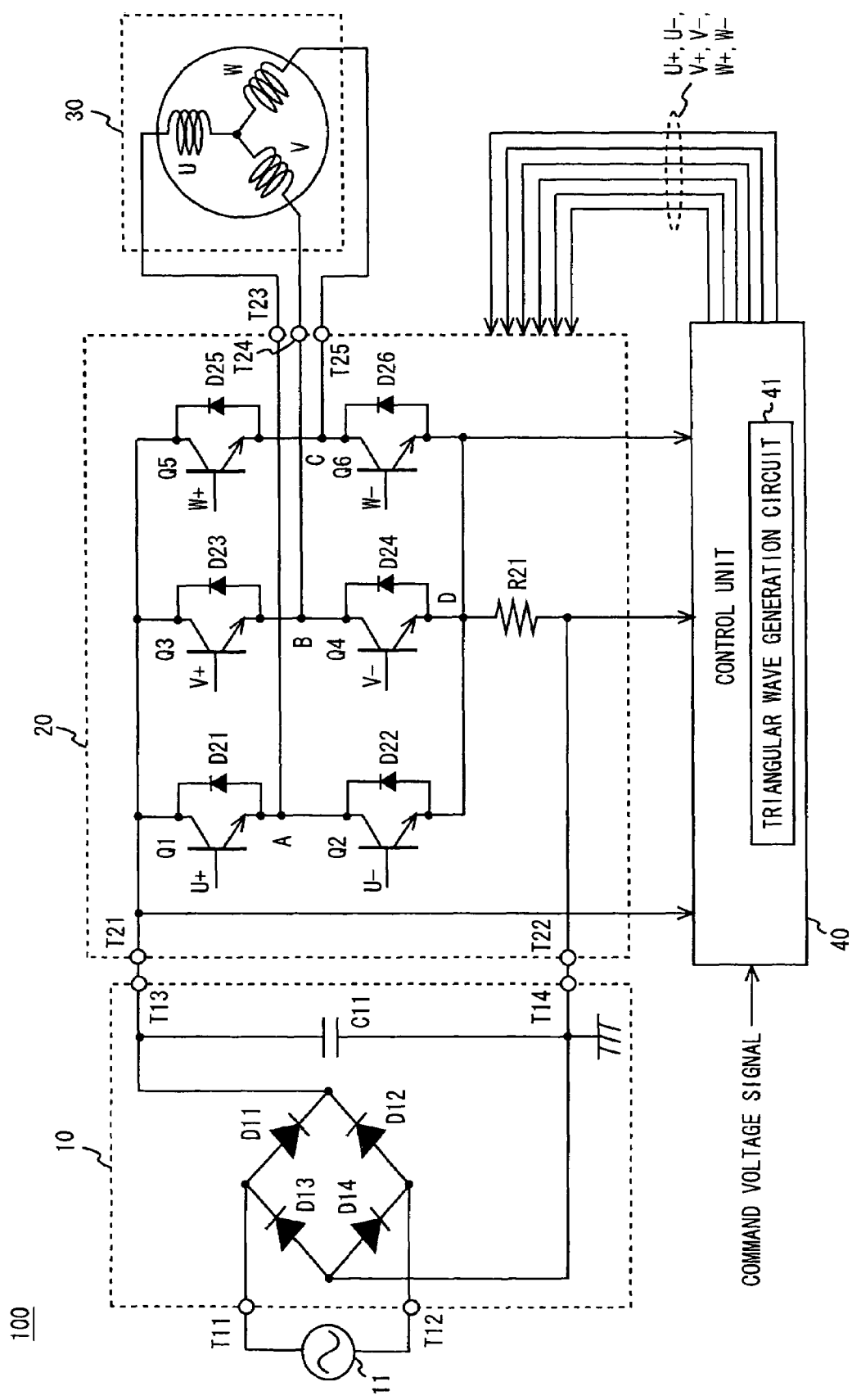
FIG. 1 shows an example of the configuration of a motor driving apparatus according to an exemplary embodiment of the present invention.

Exemplary embodiments to which the present invention is applied will be described in detail below with reference to the drawings. In this exemplary embodiment, the present invention is applied to a motor driving apparatus. FIG. 1 shows an example of the configuration of a motor driving apparatus 100 according to this exemplary embodiment. As shown in FIG. 1, the motor driving apparatus 100 includes a converter unit 10, an inverter unit 20, a brushless DC motor 30, and a control unit 40.

The converter unit 10 rectifies a voltage supplied from a general commercial AC power supply 11 to convert it into a DC voltage. The converter unit 10 includes input terminals T11 and T12, output terminals T13 and T14, rectifier diodes D11 to D14, and a smoothing capacitor C11. The rectifier diode D11 has an anode connected to the input terminal T11 and a cathode connected to the output terminal T13. The rectifier diode D12 has an anode connected to the input terminal T12 and a cathode connected to the output terminal T13. The rectifier diode D13 has an anode connected to the output terminal T14 and a cathode connected to the input terminal T11. The rectifier diode D14 has an anode connected to the output terminal T14 and a cathode connected to the input terminal T12. The smoothing capacitor C11 has one terminal connected to the output terminal T13 and the other terminal connected to the output terminal T14. The output terminal T14 is connected to a ground voltage terminal GND.

The inverter unit 20 includes NPN transistors Q1 to Q6, clamp diodes D21 to D26, and a resistor element R21. The inverter unit 20 also includes power supply input terminals T21 and T22, and output terminals T23 to T25.

The NPN transistors Q1 to Q6 are switching elements for controlling a motor drive current flowing through each of U-phase, V-phase, and W-phase coils of the brushless DC motor 30 described later. The NPN transistor Q1 has a collector connected to the power supply input terminal T21 and an emitter connected to a node A. The NPN transistor Q2 has a collector connected to the node A and an emitter connected to a node D. The NPN transistor Q3 has a collector connected to the power supply input terminal T21 and an emitter connected to a node B. The NPN transistor Q4 has a collector connected to the node B and an emitter connected to the node D. The NPN transistor Q5 has a collector connected to the power supply input terminal T21 and an emitter connected to a node C. The NPN transistor Q6 has a collector connected to the node C and an emitter connected to the node D. The bases of the NPN transistors Q1 to Q6 receive control signals U+, U−, V+, V−, W+, and W−, respectively, from the control unit 40. The nodes A to C are connected to the output terminals T23 to T25, respectively.

The clamp diodes D21 to D26 are connected in anti-parallel and are each connected between the emitter and collector of each of the NPN transistors Q1 to Q6.

The resistor element R21 is a resistor for detecting the motor drive current flowing through each of the U-phase, V-phase, and W-phase coils of the brushless DC motor 30. Information as to a rotational position of a rotor of the brushless DC motor 30, for example, can be acquired from information about the control signals from the control circuit 40 described later and measurement information about the amount and phase of a current flowing through the resistor element R21. The resistor element R21 is desirably composed of a shunt resistor, because the resistor element R21 is used for current measurement. In this case, however, the type of the resistor is not necessarily limited to the shunt resistor.

The brushless DC motor 30 is composed of a permanent magnet synchronous motor or the like. The brushless DC motor 30 includes coils of three phases of U-phase, V-phase, and W-phase, each serving as a stator. The U-phase, V-phase, and W-phase coils are commonly connected at their one end, and the other ends thereof are connected to the terminals T23 to T25 of the inverter unit, respectively. A current flows from the inverter unit 20 through the three-phase coils, which rotates the rotor formed of a permanent magnet.

The control unit 40 generates the control signals U+, U−, V+, V−, W+, and W− and outputs them to the inverter unit 20. Further, the control unit 40 monitors a voltage Vin applied between the power supply input terminals T21 and T22 of the inverter unit 20. Furthermore, the control unit 40 monitors a voltage at the node D and measures a current flowing through the resistor element R21. The control unit 40 can recognize how much current is flowing through each of the three-phase coils of the brushless DC motor 30, on the basis of a relationship between the measurement result of the current flowing through the resistor element R21 and the output timing of the control signals U+, U−, V+, V−, W+, and W− generated by the control unit 40. As a result, the position of the rotor of the brushless DC motor 30 can be detected. Moreover, when an overcurrent flows through the resistor element R21, the occurrence of a failure due to a short circuit between lines of the brushless DC motor 30 and the inverter unit 20, for example, can be sensed.

Figure 7:
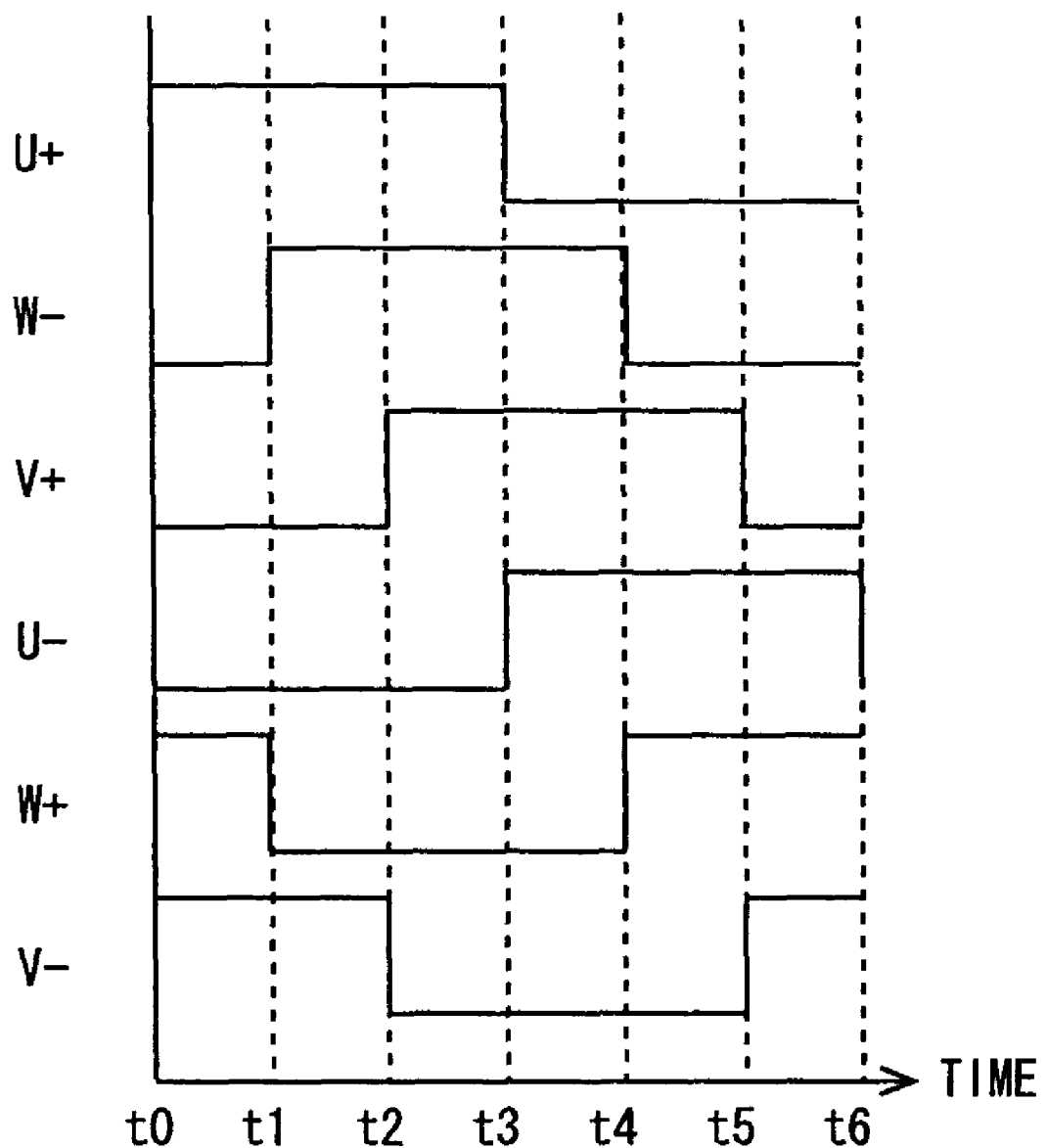
FIG. 7 shows an example of an operation timing diagram of an inverter unit of the related art.
Figure 8:
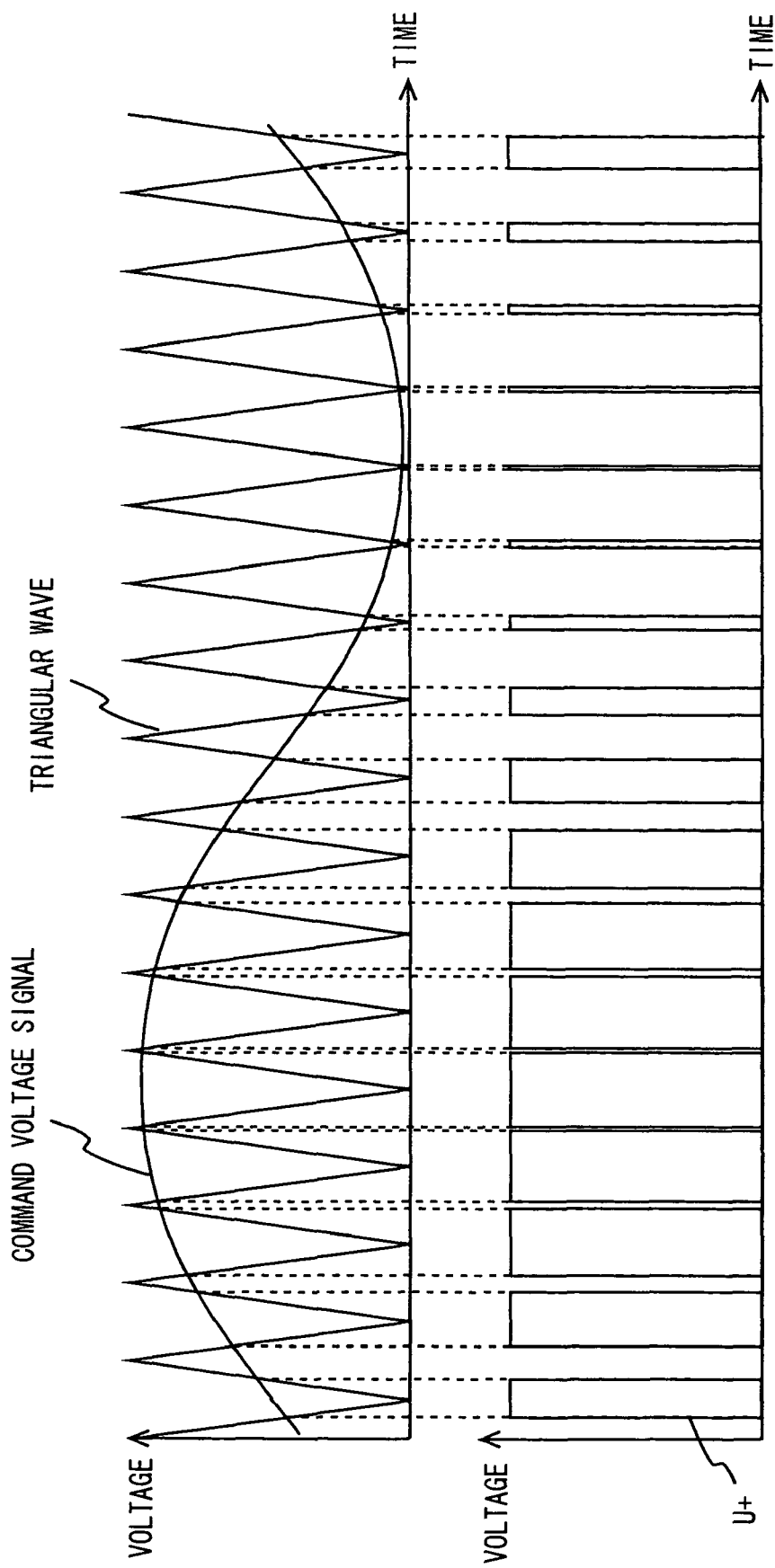
FIG. 8 shows an example of a timing diagram illustrating PWM control.
Figure 9:
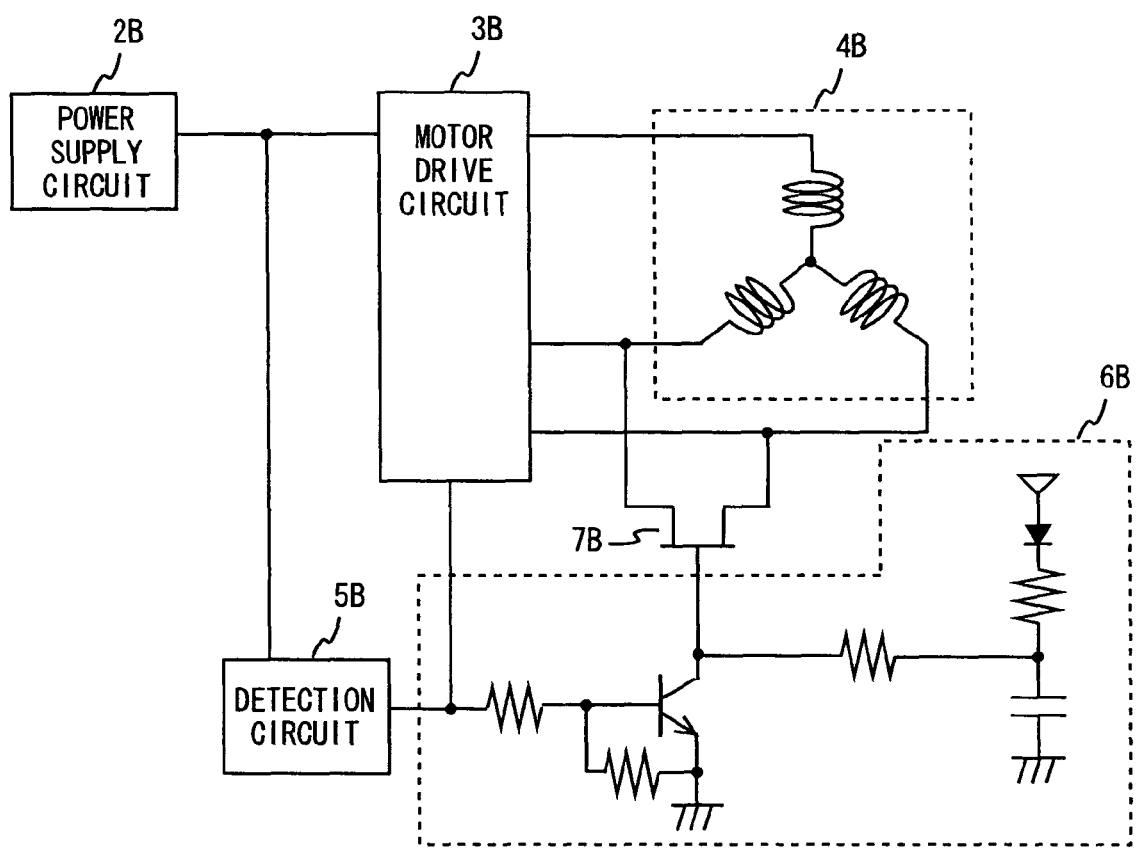
FIG. 9 shows the configuration of a back electromotive force eliminating device of the related art.

The control unit 40 includes a triangular wave generation circuit 41. The triangular wave generation circuit 41 generates a triangular wave as a carrier for PWM control. Further, the triangular wave generation circuit 41 is capable of changing the carrier frequency of the generated triangular wave. The timing for changing the carrier frequency is controlled by the control unit 40. The control unit 40 uses the triangular wave generated by the triangular wave generation circuit 41 as a carrier, and outputs the control signals U+, U−, V+, V−, W+, and W− which are obtained by performing pulse width modulation on a command voltage signal. The switching operations of the NPN transistors Q1 to Q6 of the inverter unit 20 are controlled by the control signals U+, U−, V+, V−, W+, and W−, respectively. At this time, the current flowing through the NPN transistors Q1 to Q6 is output to the output terminals T23 to T25 as a drive current for the brushless DC motor 30. In this case, the command voltage signal is a signal for controlling the brushless DC motor 30 to rotate at a desired number of rotations. Note that a relationship among the triangular wave, the command voltage signal, and the pulse width of the generated control signal is similar to that described with reference to the graphs shown in FIG. 7, so a description thereof is omitted.

Figure 2:
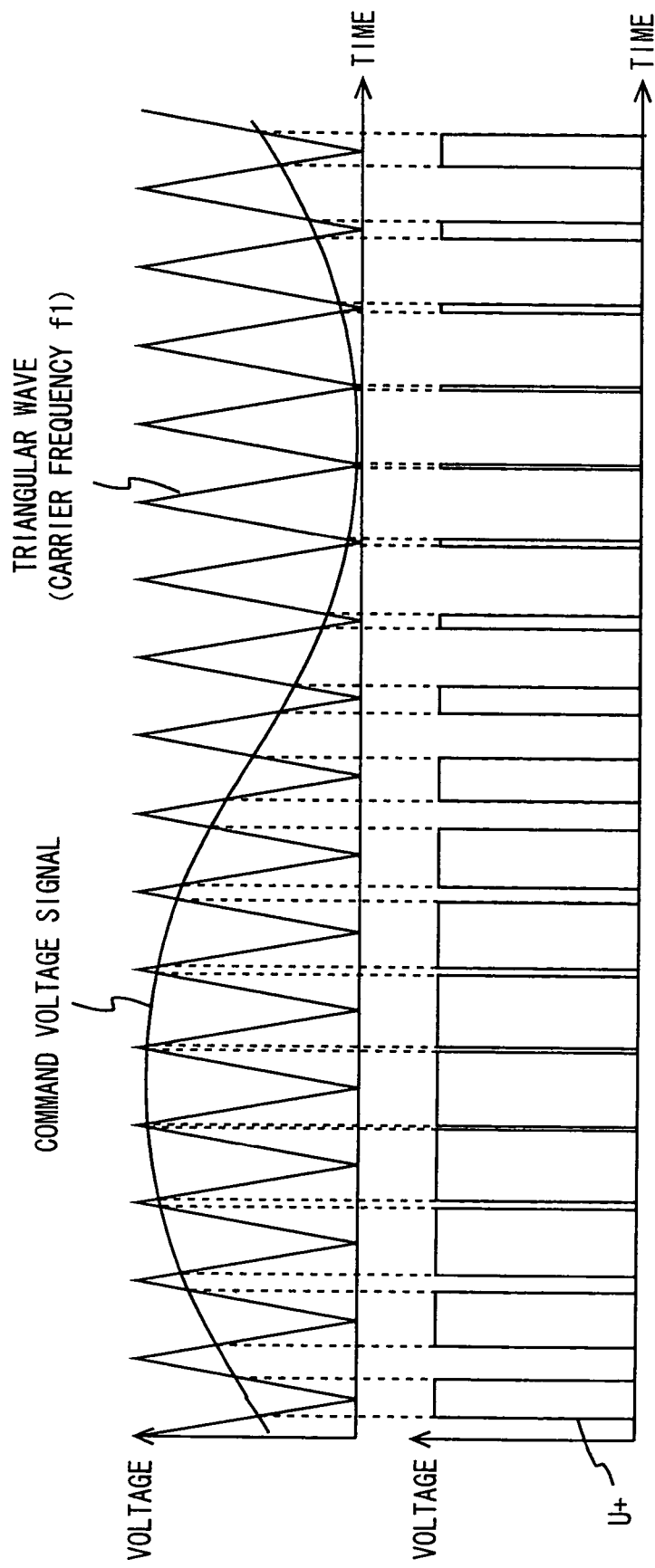
FIG. 2 is a graph showing a relationship between a control signal and a carrier frequency according to an exemplary embodiment of the present invention.
Figure 3:
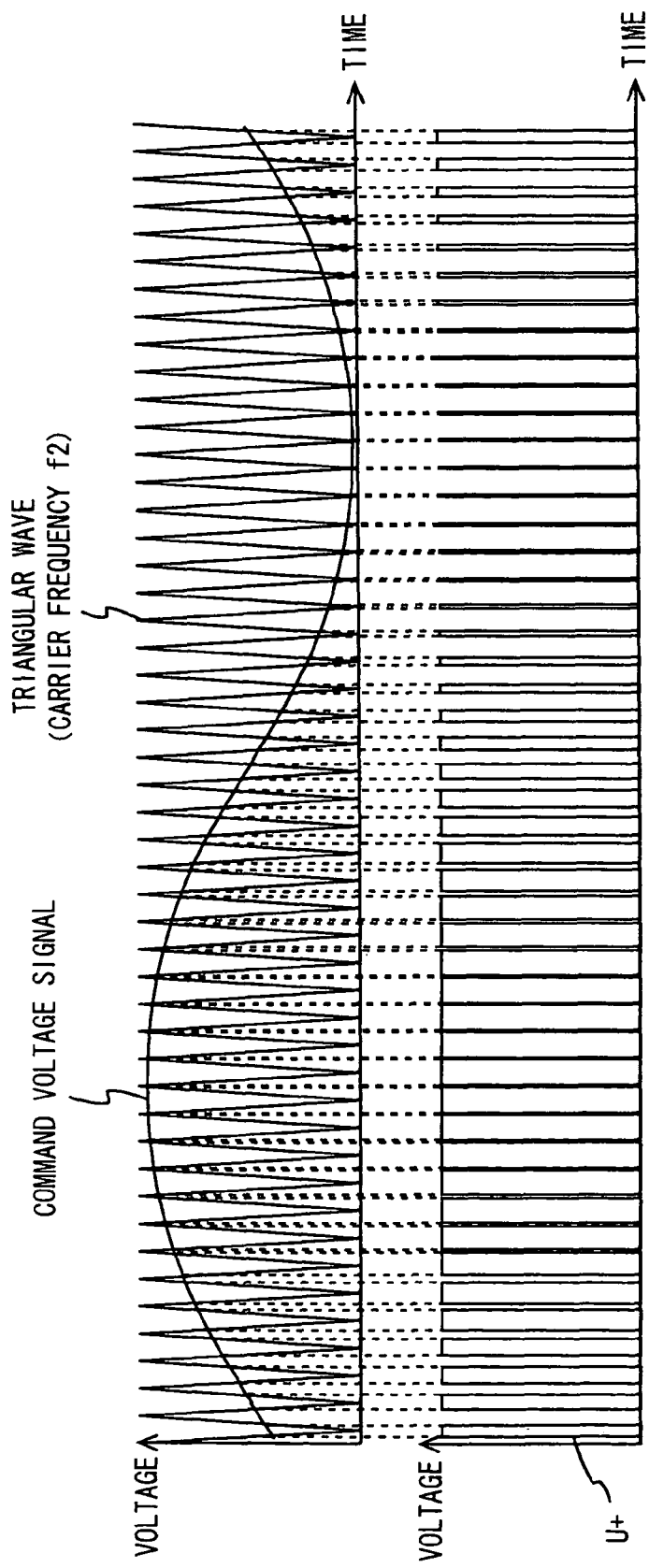
FIG. 3 is a graph showing a relationship between a control signal and a carrier frequency according to an exemplary embodiment of the present invention.

As described above, the triangular wave generation circuit 41 is capable of changing the carrier frequency of the triangular wave to be generated. FIGS. 2 and 3 each show an example of the relationship among the command voltage signal, the carrier (triangular wave), and the control signal U+ in the case where the carrier frequency is changed. FIG. 3 shows the control signal U+ in the case where a carrier frequency f2 is set to be about three times as high as a carrier frequency f1 of FIG. 2. It is obvious from FIGS. 2 and 3 that the control signal U+ shown in FIG. 3 has a pulse width smaller than that of the control signal U+ shown in FIG. 2. Accordingly, when the control signal U+ shown in FIG. 3 is input to the base of the NPN transistor Q1, the number of on/off switching operations of the NPN transistor Q1 increases compared to the case where the control signal U+ shown in FIG. 2 is input to the base. Note that, as shown in FIGS. 2 and 3, since the command voltage signal remains unchanged, the amount of the drive current supplied to the brushless DC motor 30 hardly varies. In other words, the number of rotations of the motor or the like remains unchanged even if the carrier frequency varies.

The control unit 40 changes the carrier frequency when the voltage Vin applied between the power supply input terminals T21 and T22 of the inverter unit 20 becomes an abnormal voltage that is equal to or higher than an abnormal voltage detecting voltage Ve. In addition, the control unit 40 increases the carrier frequency of the triangular wave generated by the triangular wave generation circuit 41 to the frequency f2 that is several times to several tens of times (at least twice) as high as the frequency f1 of the normal operation state.

Figure 4:
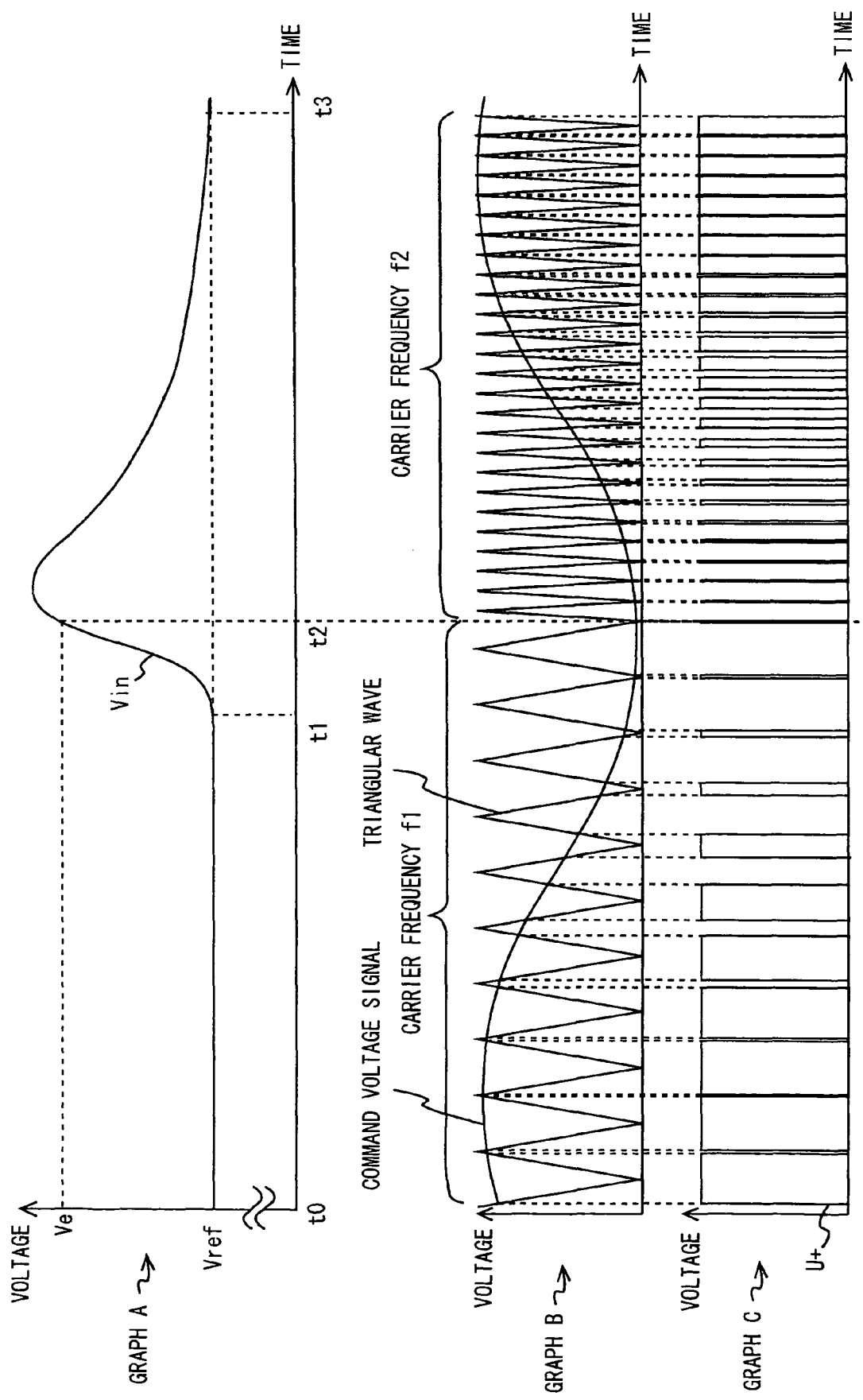
FIG. 4 shows an example of an operation timing diagram of the motor driving apparatus according to an exemplary embodiment of the present invention.

Next, the operations of the motor driving apparatus 100 will be described in detail with reference to the drawings. Graphs A to C of FIG. 4 each show an operation timing of the motor driving apparatus 100. The graph A of FIG. 4 shows the voltage applied between the power supply input terminals T21 and T22 of the inverter unit 20. The graph B of FIG. 4 shows the triangular wave generated by the triangular wave generation circuit 41 and the command voltage signal. The graph C of FIG. 4 shows the pulse shape of the control signal U+. Note that only the control signal U+ is described in this exemplary embodiment.

As shown in the graph A of FIG. 4, during a time period between a time t0 and a time t1, the voltage Vin which is applied between the power supply input terminals T21 and T22 of the inverter unit 20 and which is detected by the control unit 40 is held constant at a reference voltage Vref. Thus, the control signal U+ output to the inverter unit 20 by the control unit 40 also has a pulse shape of the normal operation state.

At the time t1, the brushless DC motor 30 is rapidly decelerated, or the driving of the motor cannot be controlled due to a system malfunction, for example. In this case, the motor comes into a regenerative state (power generation state) due to load inertia. The voltage applied to the input side of the inverter unit 20, that is, the voltage Vin applied between the power supply input terminals T21 and T22 increases due to a back electromotive force generated by the motor.

At a time t2, the voltage Vin which is applied between the power supply input terminals T21 and T22 of the inverter unit 20 and which is detected by the control unit 40 is higher than the voltage abnormality detecting voltage Ve (this state is hereinafter referred to as "abnormal state"). At this time, the control unit 40 increases the carrier frequency of the triangular wave generated by the triangular wave generation circuit 41 to the frequency f2 that is several times to several tens of times as high as the frequency f1 at the time of normal operation. For example, the control unit 40 increases the carrier frequency from 5 kHz (frequency f1) to 200 kHz (frequency f2), i.e., increases the carrier frequency by 40 times.

In this case, when the NPN transistors Q1 to Q6 are switched from the on-state to the off-state or switched from the off-state to the on-state, a loss occurs during a transition period. This loss is called a switching loss and generally widely known. The switching loss increases in proportion to the on/off switching frequency of the transistors.

For this reason, when the carrier frequency increases from the frequency f1 to the frequency f2 as described above, the number of switching operations of the transistors increases, and the switching loss caused by the NPN transistors Q1 to Q6 also increases. Thus, the back electromotive force generated by the motor in the regenerative state is absorbed as thermal energy as a result of the increased switching loss caused by the NPN transistors Q1 to Q6, which reduces the voltage Vin applied between the power supply input terminals T21 and T22.

At a time t3, the voltage Vin applied between the power supply input terminals T21 and T22 drops to the reference voltage Vref, and the abnormal state ends. Then, the control unit 40 may output the control signals U+, U−, V+, V−, W+, and W− to the inverter unit 20 after changing the carrier frequency of each control signal to the carrier frequency f1 of the normal operation state again. Alternatively, when determining that the driving of the motor cannot be controlled due to a system malfunction or the like, the control unit 40 may continue to output the control signals U+, V+, and W+ having the high carrier frequency f2 to the inverter unit 20.

Figure 5:
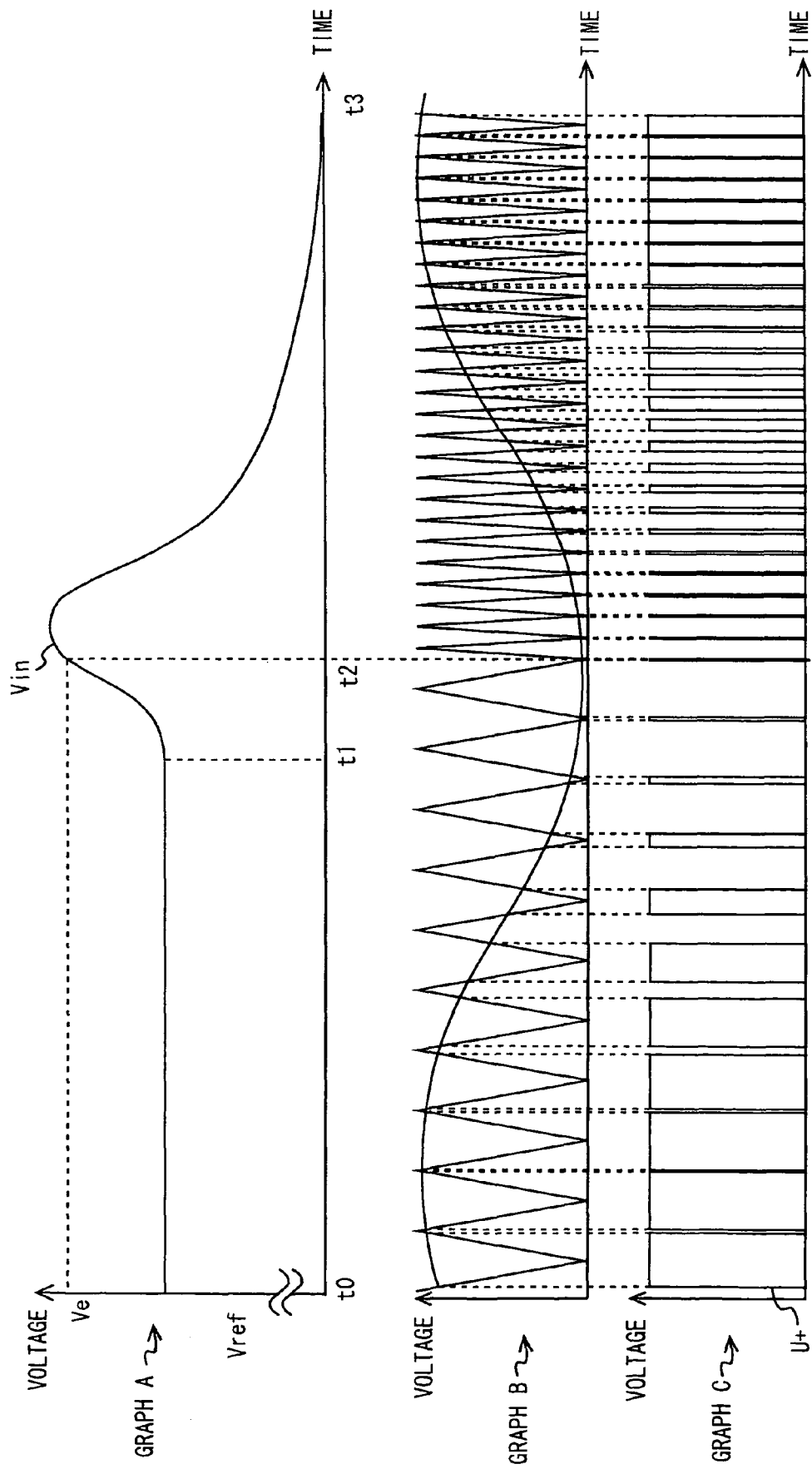
FIG. 5 shows an example of an operation timing diagram of the motor driving apparatus according to an exemplary embodiment of the present invention.
Figure 6:
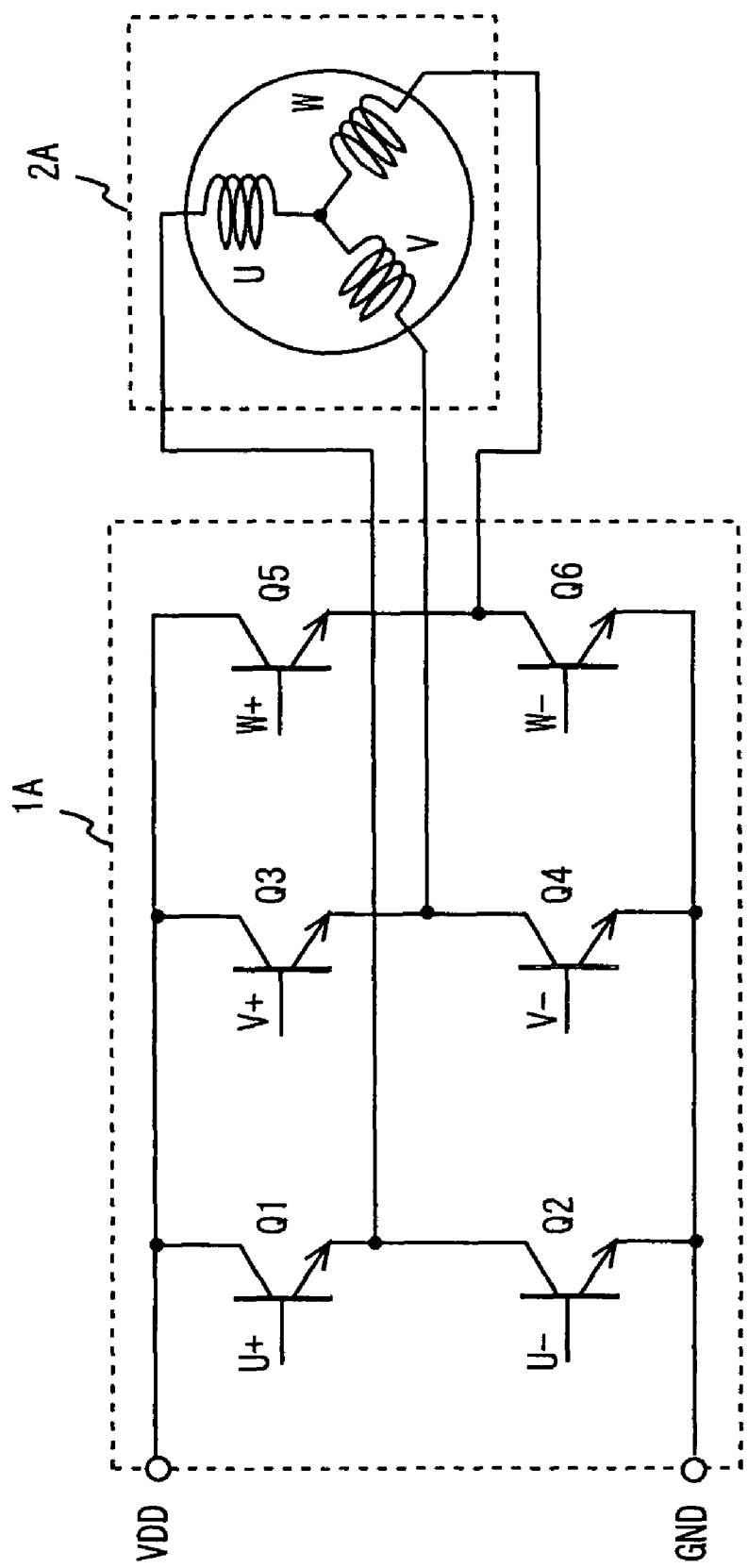
FIG. 6 shows an example of the configuration of a motor driving apparatus of the related art.

Furthermore, at a time point when the control unit 40 detects the abnormal state, the power supply to the inverter unit 20 by the converter unit 10 may be shut off. In this case, the voltage Vin drops to the ground voltage at the time t3 as shown in FIG. 5.

As described above, the motor driving apparatus 100 according to this exemplary embodiment absorbs the back electromotive force, which is generated by the motor in the regenerative state, as thermal energy as a result of an increase in the switching loss of the transistors of the inverter 20 due to an increase in the carrier frequency. Accordingly, there is no need of additionally providing a back electromotive force absorbing resistor element or the like to the motor driving apparatus 100, and thus the above-mentioned effects can be obtained by using the existing components. This prevents an increase in the circuit size of the apparatus and leads to a reduction in manufacturing costs or the like of the apparatus. Further, the above-mentioned operations are started when a predetermined voltage such as the abnormality detecting voltage Ve is detected, which is advantageous in eliminating the need of using a transistor or a smoothing capacitor having a higher breakdown voltage performance than necessary.

Furthermore, since the back electromotive force is absorbed as thermal energy as a result of the increased switching loss of the transistors, the generated back electromotive force gradually decreases. This reduces the risk of mechanical damage due to rapid braking of the motor which is a problem inherent in the technology disclosed in Japanese Unexamined Patent Application Publication No. 02-290174. Moreover, the problem of heat generation can be alleviated by adjusting a change in the carrier frequency.

Note that the present invention is not limited to the above-mentioned exemplary embodiments, and various modifications can be made as needed without departing from the scope of the present invention. For example, MOS-FETs or IGBTs (Insulated Gate Bipolar Transistors) may be used as the NPN transistors that constitute the inverter unit 20. Further, the brushless DC motor 30 may be composed of a two-phase motor or a multi-phase motor, instead of the three-phase motor. Furthermore, not only the triangular wave but also a saw-tooth wave or the like may be used as a carrier for pulse width modulation.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A motor driving apparatus comprising:
   a motor drive unit including a plurality of transistors which are repeatedly turned on and off in response to a pulse having a pulse width modulated at a first carrier frequency to control driving of a motor in a normal state, and which supply a drive current to the motor; and
   a control unit that controls the plurality of transistors to be turned on and off in response to a pulse having a pulse width modulated at a second carrier frequency higher than the first carrier frequency, when a voltage applied between input terminals of the motor drive unit rises to a predetermined value.

2. The motor driving apparatus according to claim 1, wherein the second carrier frequency is at least twice as high as the first carrier frequency.

3. The motor driving apparatus according to claim 1, wherein the control unit measures the drive current of the motor through a first resistor element provided in common to the plurality of transistors.

4. The motor driving apparatus according to claim 3, wherein the plurality of transistors comprise a first transistor, a second transistor, a third transistor, and a fourth transistor,
   the first transistor and the second transistor are connected in series between one of the input terminals and a first node,
   the third transistor and the fourth transistor are connected in series between an other of the input terminals and the first node,
   the motor is connected to a second node between the first transistor and the second transistor and to a third node between the third transistor and the fourth transistor, and
   the first resistor element is connected between the first node and the other of the input terminals.

5. The motor driving apparatus according to claim 3, wherein the first resistor element comprises a shunt resistor.

6. The motor driving apparatus according to claim 1, wherein the control unit comprises a wave generation circuit configured to receive a command voltage signal, and
   wherein the control unit generates either a first carrier signal carrying the command voltage signal or a second carrier signal carrying the command voltage signal.

7. The motor driving apparatus according to claim 6, wherein, when the wave generation circuit generates the second carrier signal, the wave generating circuit outputs the pulse having the pulse width modulated at the second carrier frequency.

8. The motor driving apparatus according to claim 6, wherein the first carrier signal and the second carrier signal each comprise a triangular wave signal.

9. The motor driving apparatus according to claim 1, wherein the motor is configured to be driven by a current, and an amount of the current driving the motor at the first carrier frequency is substantially equal to an amount of the current driving the motor at the second carrier frequency.

10. The motor driving apparatus according to claim 1, wherein, when the voltage applied between the input terminals of the motor drive unit rises to the predetermined level, the control unit outputs the second carrier frequency until the voltage between the input terminals of the motor drive unit falls to a reference voltage of the normal state, which is below the predetermined level.

11. The motor driving apparatus according to claim 1, wherein the control unit outputs the first carrier frequency unless the voltage applied between the input terminals rises to the predetermined value.

12. The motor driving apparatus according to claim 1, wherein a change of a frequency value between the first carrier frequency and the second carrier frequency is adjustable.

13. The motor driving apparatus according to claim 1, wherein, when the voltage applied between, the input terminals of the motor drive unit rises to the predetermined level, a power supply supplying the voltage is shut off.

14. The motor driving apparatus according to claim 1, wherein, when the plurality of transistors are repeatedly turned on and off in response to the pulse having the pulse width modulated at the first carrier frequency, a first switching loss is generated, and wherein, when the plurality of transistors are repeatedly turned on and off in response to the pulse having the pulse width modulated at the second carrier frequency, a second switching loss is generated, and reduces the voltage applied between the input terminals of the motor drive unit.

15. The motor driving apparatus according to claim 1, wherein, when the motor is uncontrollable, the control unit outputs a control signal having the second carrier frequency.

16. A method of controlling a motor driving apparatus including a plurality of transistors which are repeatedly turned on and off in response to a pulse having a pulse width modulated at a first carrier frequency to control driving of a motor in a normal operation state and which supply a drive current to the motor, the method comprising:

controlling the plurality of transistors to be turned on and off in response to a pulse having a pulse width modulated, at a second carrier frequency higher than the first carried frequency, when a regenerative electromotive force generated by the motor occurs.

17. The method of controlling a motor driving apparatus according to claim 16, wherein the second, carrier frequency is controlled to be at least twice as high as the first carrier frequency.

18. A motor driving apparatus comprising:
a motor drive unit including a plurality of transistors that supply a drive current to a motor; and
a control unit that monitors a voltage applied between input terminals of the motor drive unit, and that controls the plurality of transistors,
wherein the control unit outputs a control signal generated in accordance with a first carrier frequency to the plurality of transistors, when the voltage applied between the input terminals of the motor drive unit is below a predetermined value, and
wherein the control unit outputs a control signal generated in accordance with a second carrier frequency that is higher than the first carrier frequency to the plurality of transistors, when the voltage applied between the input terminals of the motor drive unit rises to the predetermined value.

19. The motor driving apparatus according to claim 18, further comprising a triangular wave generation circuit that generates a triangular wave with any carrier frequency based on an instruction from the control unit, wherein the control unit outputs the control signal comprising a pulse width modulated at the first carrier frequency to the plurality of transistors, the first carrier frequency being output from the triangular wave generation circuit, when the voltage applied between the input terminals of the motor drive unit is below the predetermined value, and wherein the control unit outputs the control signal comprising a pulse width modulated at the second carrier frequency that is higher than the first carrier frequency to the plurality of transistors, the second carrier frequency being output from the triangular wave generation circuit, when the voltage applied between the input terminals of the motor drive unit rises to the predetermined value.

20. The motor driving apparatus according to claim 19, where the plurality of transistors repeatedly turn on and off in response to the control signal.

* * * * *